(12) United States Patent
Wu et al.

(10) Patent No.: US 8,709,706 B2
(45) Date of Patent: Apr. 29, 2014

(54) METHODS AND APPARATUS FOR PERFORMING MULTIPLE PHOTORESIST LAYER DEVELOPMENT AND ETCHING PROCESSES

(75) Inventors: Banqiu Wu, Sunnyvale, CA (US); Ajay Kumar, Cupertino, CA (US); Kartik Ramaswamy, San Jose, CA (US); Omkaram Nalamasu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 65 days.

(21) Appl. No.: 13/455,784

(22) Filed: Apr. 25, 2012

(65) Prior Publication Data

US 2012/0322011 A1 Dec. 20, 2012

Related U.S. Application Data

(60) Provisional application No. 61/497,346, filed on Jun. 15, 2011.

(51) Int. Cl.
*G03F 7/26* (2006.01)
(52) U.S. Cl.
USPC .......................... 430/325; 430/313; 430/323
(58) Field of Classification Search
USPC .................................................. 430/311, 313
See application file for complete search history.

(56) References Cited

U.S. PATENT DOCUMENTS

| 5,215,867 A * | 6/1993 | Stillwagon et al. ............ 430/323 |
| 6,183,937 B1 | 2/2001 | Tsai et al. |
| 6,551,938 B1 | 4/2003 | Wu et al. |
| 2008/0182419 A1* | 7/2008 | Yasui et al. .................... 438/710 |
| 2012/0103939 A1* | 5/2012 | Wu et al. ........................ 216/70 |

FOREIGN PATENT DOCUMENTS

JP 2004241575 A 8/2004

OTHER PUBLICATIONS

PCT international search report and written opinion of PCT/US2012/034944 dated Nov. 29, 2012.

* cited by examiner

*Primary Examiner* — Kathleen Duda
(74) *Attorney, Agent, or Firm* — Patterson & Sheridan, LLP

(57) ABSTRACT

The present invention provides methods and an apparatus controlling and minimizing process defects in a development process, and modifying line width roughness (LWR) of a photoresist layer after the development process, and maintaining good profile control during subsequent etching processes. In one embodiment, a method for forming features on a substrate includes developing and removing exposed areas in the photosensitive layer disposed on the substrate in the electron processing chamber by predominantly using electrons, removing contaminants from the substrate by predominantly using electrons, and etching the non-photosensitive polymer layer exposed by the developed photosensitive layer in the electron processing chamber by predominantly using electrons.

19 Claims, 6 Drawing Sheets

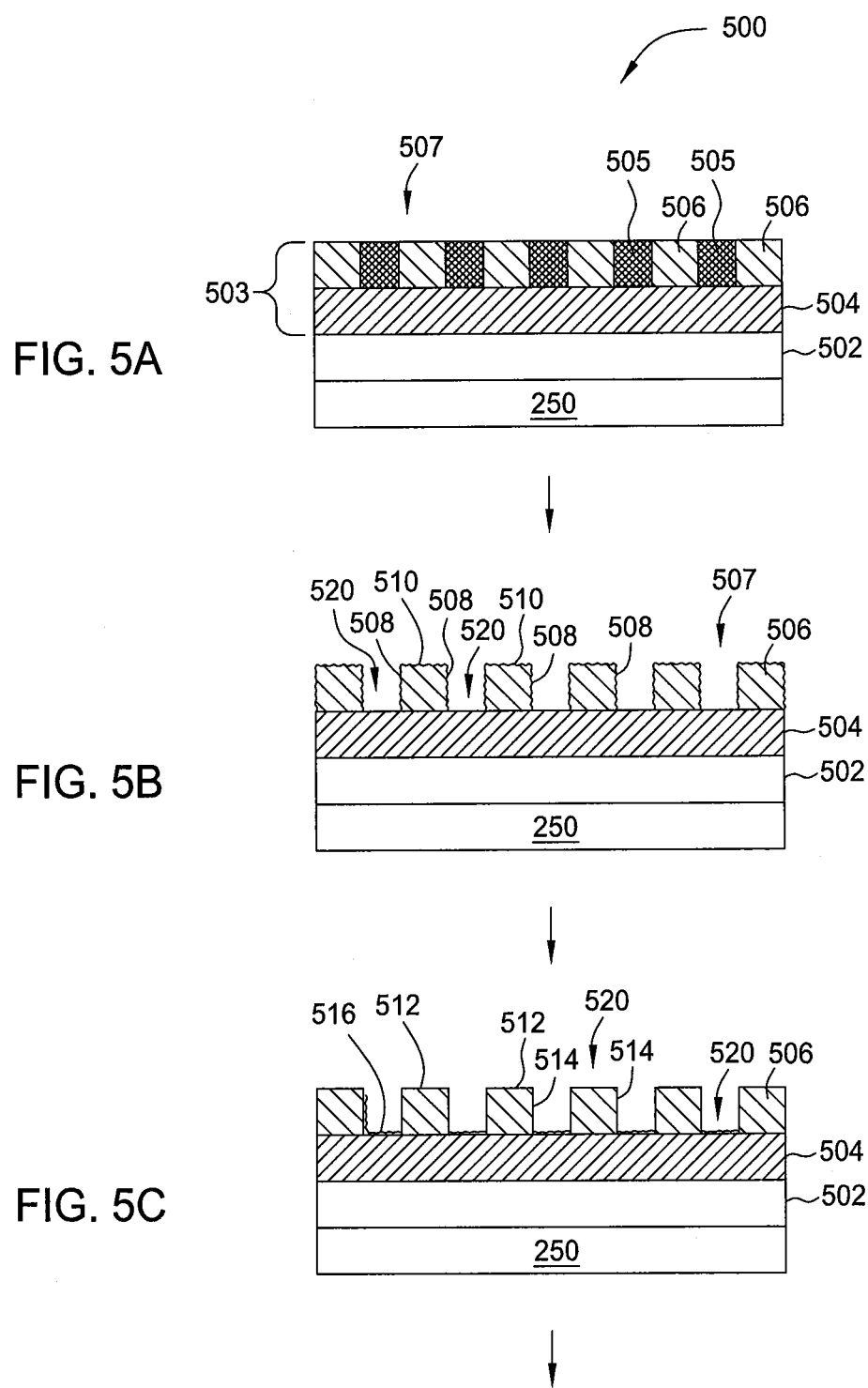

METHODS AND APPARATUS FOR PERFORMING MULTIPLE PHOTORESIST LAYER DEVELOPMENT AND ETCHING PROCESSES

CROSS REFERENCE TO RELATED APPLICATION

This application claims benefit of U.S. Provisional Patent Application No. 61/497,346, filed Jun. 15, 2011, which is incorporated by reference in its entirety.

BACKGROUND

1. Field of the Invention

The present invention generally relates to methods and apparatus for performing a photoresist development process, a photoresist line width roughness process, a defect control process, and an etching process and, more specifically, to methods and apparatus for performing a photoresist development process, a photoresist line width roughness process, a defect control process, and an etching process in a single chamber in semiconductor processing technologies.

2. Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

As the dimensions of the integrated circuit components are reduced (e.g. to sub-micron dimensions), more elements are required to be put in a given area of a semiconductor integrated circuit. Accordingly, lithography processes have become more and more challenging to transfer even smaller features onto a substrate precisely and accurately without damage. In order to transfer precise and accurate features onto a substrate, a desired high resolution lithography process requires having a suitable light source that may provide a radiation at a desired wavelength range for exposure. Furthermore, the lithography process requires transferring features onto a photoresist layer with minimum photoresist line width roughness (LWR). After all, a defect-free photomask is required to transfer desired features onto the photoresist layer. Recently, an extreme ultraviolet (EUV) radiation source has been utilized to provide short exposure wavelengths so as to provide a further reduced minimum printable size on a substrate. However, at such small dimensions, the roughness of the edges of a photoresist layer has become harder and harder to control.

In a conventional lithography process, some portions of a photoresist layer disposed on a substrate are exposed to incident radiation to undergo a chemical transformation. In a traditional positive tone exposure process, the exposed portion of the photoresist layer experiencing the chemical transformation is removed during development processes with an aqueous base solution. As the feature sizes formed on microelectronic devices continue to shrink, the aqueous base solution developer may become problematic due to image collapse caused by the capillary forces and surface tension of water. Furthermore, solution based developer tends to leave undesired contaminates on the substrate after the development process, thereby adversely effecting the substrate cleanliness.

Furthermore, after the development process, non-smooth edges of developed features also become problematic as feature sizes get smaller. FIG. 1 depicts an exemplary top isometric sectional view of a substrate 100 having a patterned photoresist layer 104 disposed on a target material 102 to be etched after the development process. Openings 106 are defined between the patterned photoresist layer 104 ready to expose the underlying target material 102 for etching to transfer features onto the target material 102. However, inaccurate control or low resolution of the lithography exposure process may cause poor critical dimension control in the photoresist layer 104, thereby resulting in unacceptable LWR 108. Large LWR 108 of the photoresist layer 104 may result in inaccurate feature transfer to the target material 102, thus, eventually leading to device failure and yield loss.

Therefore, there is a need for a method and an apparatus to control process defects during a develop process, and minimize LWR after the development process to obtain a patterned photoresist layer with desired critical dimensions.

SUMMARY

The present invention provides methods and an apparatus for controlling and minimizing process defect in a development process, and modifying LWR of a photoresist layer after the development process. In one embodiment, a method for forming features on a substrate includes generating an electric field in a processing chamber having a substrate disposed therein, wherein the substrate has a photosensitive layer having exposed areas and non-exposed areas, supplying a first gas mixture into the processing chamber to develop the exposed areas in the photosensitive layer, generating a magnetic field to interact with an electric field in the processing chamber to form a first plasma moving in a circular mode from the first gas mixture, supplying a second gas mixture into the processing chamber, and generating an electron beam in the magnetic field and the electric field from the second gas mixture to trim an edge profile of the developed photosensitive layer disposed on the substrate surface in the processing chamber.

In another embodiment, a method for forming features on a substrate includes transferring a substrate into a processing chamber, wherein the substrate has a photosensitive layer having exposed areas and non-exposed areas. The method further includes, extracting electrons from a plasma formed from a first gas mixture, developing the exposed areas in the photosensitive layer using the electrons extracted from the plasma formed in the first gas mixture, extracting electrons from a plasma formed from a second gas mixture supplied to the processing chamber, and trimming an edge profile of the developed photosensitive layer disposed on the substrate using electrons extracted from the plasma formed from the second gas mixture.

In another embodiment, a method for developing a photosensitive layer disposed on a substrate includes providing a substrate having a photosensitive layer having exposed areas and non-exposed areas into an electron processing chamber, and dry developing the photosensitive layer to remove the exposed areas of the photosensitive layer from the substrate.

In yet another embodiment, a method for forming features on a substrate includes providing a substrate into an electron processing chamber, wherein the substrate has a photosensitive layer disposed on a non-photosensitive polymer layer, the photosensitive layer having exposed areas and non-exposed areas, supplying a first gas mixture into the electron processing chamber to develop and remove the exposed areas in the photosensitive layer, supplying a second gas mixture into the electron processing chamber to trim an edge profile of the developed photosensitive layer disposed on the substrate in the electron processing chamber, supplying a third gas mixture into the electron processing chamber to perform a contamination removal process, and supplying a fourth gas mixture into the electron processing chamber to etch the non-photosensitive polymer layer exposed by the developed photosensitive layer in the electron processing chamber.

In still another embodiment, a method for forming features on a substrate includes developing and removing exposed areas in the photosensitive layer by predominantly using electrons, trimming an edge profile of the developed photosensitive layer disposed on the substrate in the electron processing chamber by predominantly using electrons, removing contaminants from the substrate by predominantly using electrons, and etching the non-photosensitive polymer layer exposed by the developed photosensitive layer in the electron processing chamber predominantly using electrons.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

FIGS. 5A-5F are sectional views of one embodiment of an interconnect structure disposed on a substrate at different manufacturing stages according to the embodiment depicted in FIG. 4.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the present invention include methods and apparatus for controlling and minimizing process defect in a development process, modifying LWR of a photoresist layer after the development process, and maintaining good profile control during subsequent etching processes. The development process may be performed in an inductively coupled plasma (ICP) reactor to dry plasma develop the photoresist layer after an exposure process. Subsequently, the developed photoresist layer disposed on the substrate may have a LWR control process performed thereon to minimize roughness as formed on the edge line of the photoresist layer. The LWR control process may be performed in the same ICP chamber as utilized to perform the development process. The ICP process is performed to provide a chemical and electron grinding process in a nanometer scale to develop a photoresist layer after an exposure process and subsequently smooth the edge of the developed photoresist layer pattern thereby providing a smooth pattern edge of the photoresist layer with minimum pattern edge roughness for subsequent etching processes. Furthermore, a defect removal process may also be performed in the same ICP chamber after the LWR control process so as to ensure cleanliness of the substrate and subsequently performing the etching process to etch a target material disposed underneath the photoresist layer on the substrate subsequent to the defect removal process as needed.

Figure 2:
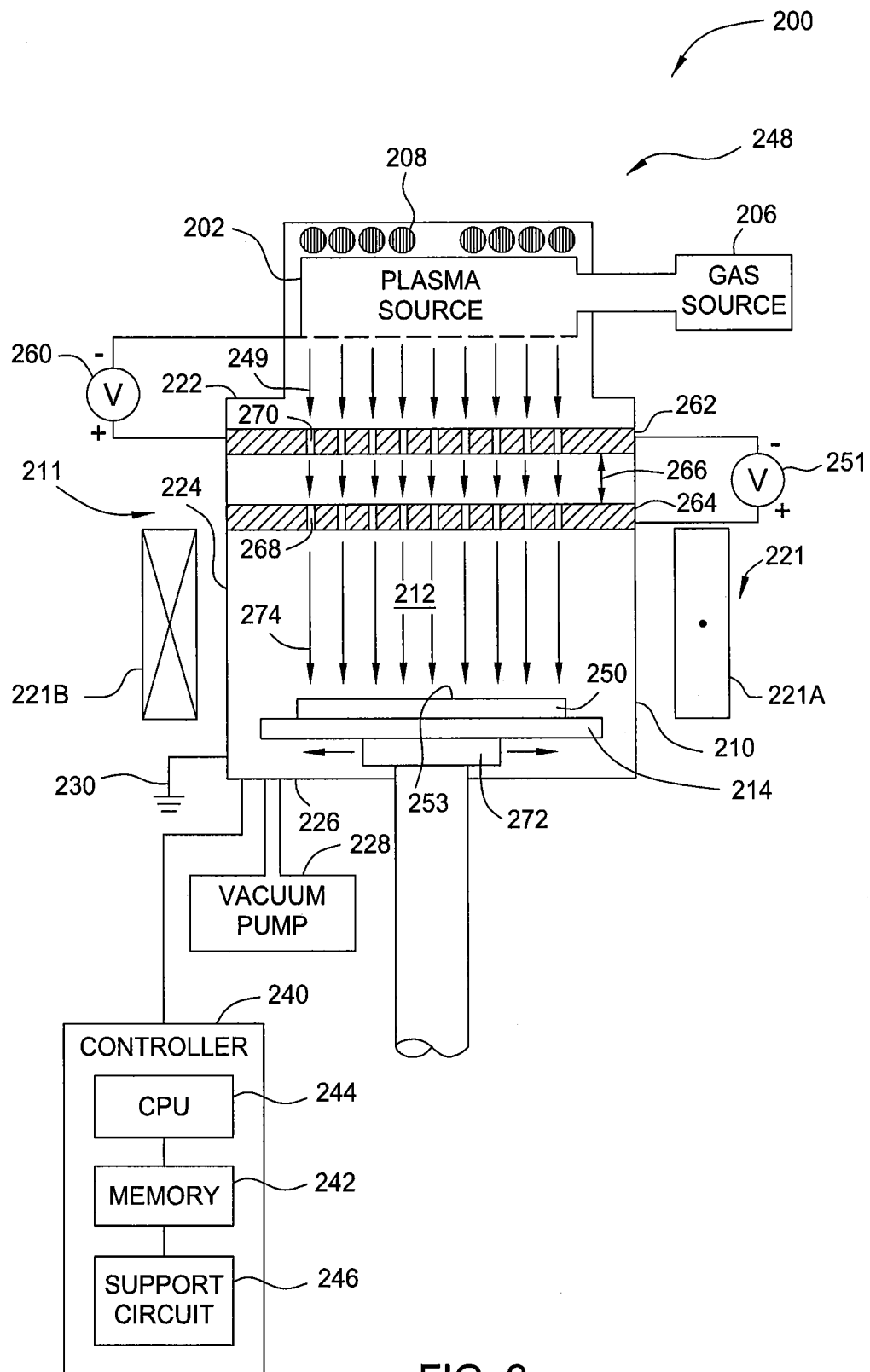
FIG. 2 depicts a schematic cross-sectional view of an inductively coupled plasma (ICP) reactor with enhanced electron spin control used according to one embodiment of the invention.

FIG. 2 depicts a schematic, cross-sectional diagram of one embodiment of an ICP reactor 200 suitable for performing an ICP process with enhanced electron spin control according to the present invention. One such etch reactor that may be adapted for performing the invention may be available from Applied Materials, Inc., of Santa Clara, Calif. It is contemplated that other suitable plasma process chamber may also be employed herein, including those from other manufacturers.

The plasma reactor 200 includes a processing chamber 248 having a chamber body 210. The processing chamber 248 is a high vacuum vessel having a vacuum pump 228 coupled thereto. The chamber body 210 of the processing chamber 248 includes a top wall 222, a sidewall 224 and a bottom wall 226 defining an interior processing region 212 therein. The temperature of the sidewall 224 is controlled using liquid-containing conduits (not shown) that are located in and/or around the sidewall 224. The bottom wall 226 is connected to an electrical ground 230.

The processing chamber 248 includes a support pedestal 214. The support pedestal 214 extends through the bottom wall 226 of the processing chamber 248 into the interior processing region 212. The support pedestal 214 may receive a substrate 250 to be disposed thereon for processing.

A plasma source 202 is disposed at the top of the chamber body 210 and configured to supply electrons to the interior processing region 212. A plurality of coils 208 may be disposed proximate the plasma source 202 to assist creating an ICP within the plasma source 202. Plasma power to the coils 208 is controlled by a RF power source and match circuit (not shown). The coils 208 may include inner and outer concentric coils in a spaced-apart relation to control the radial distribution of plasma density within the plasma source 202 and processing chamber 252. The plasma source 202 may alternatively be a microwave power source, an electron beam generator or other suitable power source.

Figure 1:
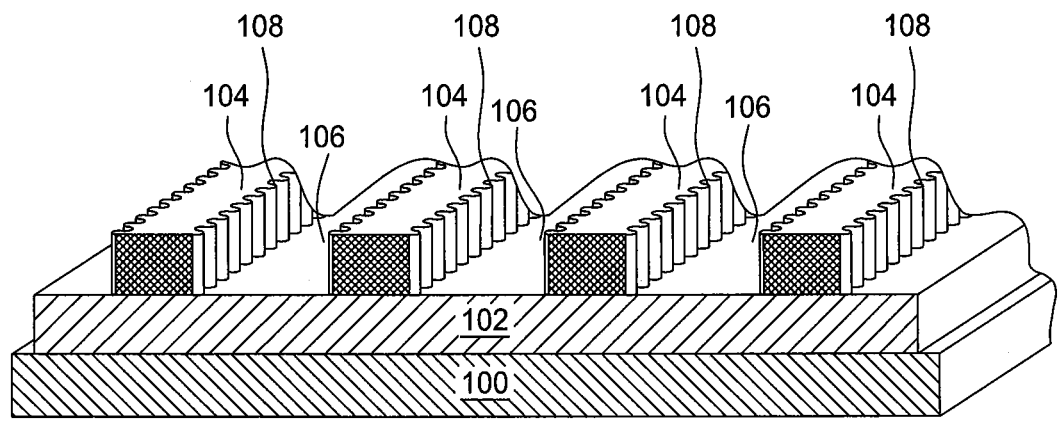
FIG. 1 depicts a top isometric sectional view of an exemplary structure of a patterned photoresist layer disposed on a substrate conventionally in the art.
Figure 3:
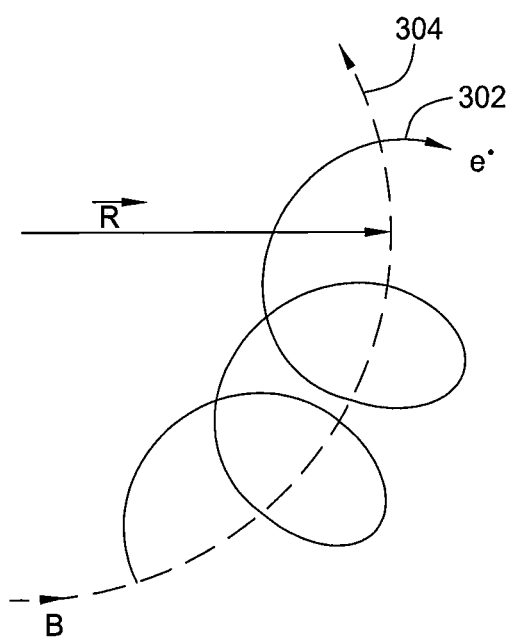
FIG. 3 depicts an electron trajectory diagram according to one embodiment of the invention.

A gas source 206 may be coupled to the plasma source 202 to deliver processing gas into the processing chamber 252. The magnetic field causes the electrons to orbit along the magnetic field lines 249 while plasma power energizes the electrons as the electrons orbit. The interaction between the electric field and magnetic field causes the gas supplied from the gas source 206 to be dissociated and forming an ICP. The ICP may include magnetic field free charges, such as electrons and ions, radicals, or neutral atoms or species, which may spin and move forward towards the support pedestal 214. The spin electrons may be accelerated toward the substrate surface in a circular mode so as to grind the structures formed on the substrate surface. Referring first to FIG. 3, FIG. 3 depicts an electron trajectory 302 in a magnetic field. As the magnetic field may cause the trajectory 302 of electrons to spin and whirl along the magnetic line 304, the electrons may be moved in a spiral and/or helical motion defining the electron trajectory 302 as the electrons move downward through the interior processing region 212 to the substrate 250.

Processing gases may be introduced to the interior processing region 212 from a gas source 206 coupled to the processing chamber 248. The processing gases from the gas source 206 are supplied to the interior processing region 212 through the plasma source 202. Current is applied to the coil 208 from a power source which creates the electric field that dissociates the gas. The processing gases dissociated by the coils 208 form a plasma above a shield plate 262 from which electrons are extracted and delivered to the interior processing region 212 for processing the substrate 250.

A group of one or more coil segments or electromagnetic coils 221 (shown as 221A and 221B) are disposed around an outer circumference of a lower portion 211 of the chamber body 210 adjacent to the interior processing region 212. Power to the coil segment(s) or magnets 221 is controlled by a DC power source or a low-frequency AC power source (not shown). The electromagnetic coils 221 generate the magnetic field in a direction perpendicular to the substrate surface. As the electrons from the plasma may not have sufficient momentum to travel down through the interior processing region 212 to an upper surface 253 of the substrate 250, the group of the coil segments or electromagnetic coils 221 may be disposed at the lower portion of the chamber body 210 (e.g., close to the interior processing region 212) to enhance spinning and/or whirling of the electrons down to the upper surface 253 of the substrate 250. The electronic field results in an electron beam (e-beam) source which provides electrons having enhanced electron spinning and/or whirling momentum down to the surface of the substrate 250.

In one embodiment, a shield plate 262 is disposed in the processing chamber 248 above the support pedestal 214. The shield plate 262 is a substantially flat plate having an orientation substantially parallel to the orientation of the support pedestal 214 and substantially perpendicular to the orientation to the centerline of the processing chamber 248. The shield plate 262 may be formed from one or more of a variety of materials compatible with processing needs. In one embodiment, the shield plate 262 may be fabricated from a material selected from a group consisting of copper or copper-coated ceramics.

The shield plate 262 includes one or more apertures 270 formed therethrough that define an open area of the shield plate 262. The open area of the shield plate 262 (i.e., the size, the number and density of the apertures 270) assists in controlling the amount electrons that pass from the plasma formed from the plasma source 202 to the interior processing region 212 above the upper surface 253 of the substrate 250. Accordingly, the shield plate 262 acts as an ion/electron filter (or electron controller) that controls the electron density and/or ion density in volume passing through the shield plate 262 to the upper surface 253 of the substrate 250. In one embodiment, the apertures 270 have a diameter between about 1 to about 10 nm. In another embodiment, the apertures 270 define an open area shield plate 262 of between about 1 to about 5 percent.

During processing, a voltage from a power source 260 may be applied to the shield plate 262. The voltage potential applied on the shield plate 262 attracts and filters out ions from the plasma, thereby efficiently allowing only neutral species, such as radicals and electrons, to pass through the apertures 270 of the shield plate 262 to the region of the interior processing region 212 below the shield plate 262 in which the substrate 250 and the support pedestal 214 reside. In other words, the shield plate 262 extracts electrons from the plasma which are subsequently utilized to process the substrate 250 with minimal presence of ions, as the ions present in the plasma have been filtered out by the shield plate 262. Thus, by reducing/filtering the amount of ions passing through the shield plate 262, the grinding and/or smoothing of the structures formed on the substrate is primarily performed by neutral species, such as radicals and electrons, i.e., hereinafter referred to as mild reactive species, which readily pass the shield plate 262 and allow the substrate 250 to be processed in a more controlled manner. Therefore, since the mild reactive species comprise predominantly radicals and electrons with little or no ions, the lack of ions reduce the likelihood of undesired erosion sputter, or overly aggressive ion bombardment that may damage the substrate surface, thereby resulting in precise smoothing performance and critical dimension uniformity. The voltage applied to the shield plate 262 may be supplied at a range sufficient to attract or retain ions from the plasma, thereby repelling the mild reactive species from the ions generated in the plasma. In one embodiment, the voltage is applied to the shield plate 262 from a DC power (or AC power) 260 between about 5 volts and about 50 volts.

A control plate 264 is disposed below the shield plate 262 and above the support pedestal 214. The control plate 264 has an orientation substantially parallel to the orientation of the support pedestal 214 and the shield plate 262, and substantially perpendicular to the orientation to the centerline of the processing chamber 248. The control plate 262 is positioned in a spaced-apart relationship with the shield plate 262 at a predetermined distance 266. In another embodiment, the control plate 264 is to attach to the shield plate 262 with minimum space in between. In one embodiment, the distance 266 between the shield plate 262 and the control plate is less than about 5 mm.

The control plate 264 has a plurality of apertures 268 that allows the mild reactive species filtered through the shield plate 262 to pass therethrough into the interior processing region 212. The apertures 268 of the control plate 264 may be aligned with the apertures 270 of the shield plate 262. In one embodiment, the apertures 268 have a diameter between about 1 to about 10 mm. In another embodiment, the apertures 268 define an open area control plate 264 of between about 1 to about 5 percent.

A voltage from a power source 251 may be applied to the control plate 264, so as to create a voltage potential (e.g., an electrical potential) that interacts with the magnetic field generated from the group of the coil segments or electromagnetic coils 221A, 221B. The electrical potential generated by the control plate 264 along with the magnetic field generated by the group of the coil segments or electromagnetic coils 221 assists and enhances maintaining sufficient momentum and energy to keep the midi reactive species, particularly the electrons in spinning down to the upper surface 253 of the substrate 250. Furthermore, the mild reactive species passing through the apertures 268 of the control plate 264 may be directed in a predetermined path, thereby confining the trajectory of the mild reactive species in a predetermined path to reach a desired area on the upper surface 253 of the substrate 250. When passing through the control plate 264, the magnified field may cause the mild reactive species passing through to keep moving in a circular mode and spinning towards the upper surface 253 of the substrate 250. The spinning mild reactive species have sufficient horizontal and vertical momentum to allow the electrons to grind the structures formed on the upper surface 253 of the substrate 250 from top to bottom without loss of critical dimension.

In one embodiment, the control plate 264 may have different materials or different characteristics. The control plate 264 may comprise more than one zone or segments having at least one characteristic that is different from each other. For example, the control plate 264 may have a number of zones with different configurations including various geometries (e.g., sizes, shapes and open areas) and the zones may be made of the same or different materials, or be adapted to have different potential biases. By providing combinations of zone configurations, materials, and/or potential bias, the spatial distribution of the mild reactive species ns in the plasma may be modified in a localized manner, allowing customization of process characteristics, such as smoothing uniformity or locally enhanced or reduced smoothing rates (e.g., to tailor to different pattern densities in different parts of a substrate) and so on. Such multi-zone control plate 264 maybe sued to actively control the neutral species, radicals, and electrons distribution, and thus, allow for enhanced process control.

During substrate processing, gas pressure within the interior of the processing chamber 248 may be controlled in a predetermined range. In one embodiment, the gas pressure within the interior processing region 212 of the processing chamber 248 is maintained at about 0.1 mTorr to 999 mTorr. The substrate 250 may be maintained at a temperature of between about 10 degrees Celsius to about 500 degrees Celsius.

Furthermore, the processing chamber 248 may include a translation mechanism 272 configured to laterally translate the support pedestal 214 relative to the control plate 264. In one embodiment, the translation mechanism 272 is coupled to the support pedestal 214 to laterally move the support pedestal 214 laterally relative to the control plate 264. In another embodiment, the translation mechanism 272 is coupled to the plasma source 202 and/or the control plate 264 and/or the shield plate 262 to laterally move the plasma source 202 and/or the control plate 264 and/or the shield plate 262 laterally relative to the support pedestal 214. In yet another embodiment, the translation mechanism 272 laterally moves one or more of plasma source 202, the control plate 264 and shield plate 262 relative to the support pedestal 214. Any suitable lateral translation mechanism may be used, such as a conveyor system, rack and pinion system, an x/y actuator, a robot, electronic motors, pneumatic actuators, hydraulic actuators, or other suitable mechanism.

The translation mechanism 272 may be coupled to a controller 240 to control the scan speed at which the support pedestal 214 and plasma source 202 and/or the control plate 264 and/or the shield plate 262 move laterally relative to one another. In addition, translation of the support pedestal 214 and the plasma source 202 and/or the control plate 264 and/or the shield plate 262 relative to one another may be along a path perpendicular to the trajectory 274 of the mild reactive species from the control plate 264 to the upper surface 253 of the substrate 250. In one embodiment, the translation mechanism 272 moves at a constant speed, of approximately 1 millimeter per seconds (mm/s). In another embodiment, the translation of the support pedestal 214 and the plasma source 202 and/or the control plate 264 and/or the shield plate 262 relative to one another may be moved in other motions.

The controller 240, including a central processing unit (CPU) 244, a memory 242, and support circuits 246, is coupled to the various components of the reactor 200 to facilitate control of the processes of the present invention. The memory 242 can be any computer-readable medium, such as random access memory (RAM), read only memory (ROM), floppy disk, hard disk, or any other form of digital storage, local or remote to the reactor 200 or CPU 244. The support circuits 246 are coupled to the CPU 244 for supporting the CPU 244 in a conventional manner. These circuits include cache, power supplies, clock circuits, input/output circuitry and subsystems, and the like. A software routine or a series of program instructions stored in the memory 242, when executed by the CPU 244, causes the reactor 200 to perform a plasma process of the present invention.

FIG. 2 only illustrates one exemplary configuration of a plasma reactor 200 that can be used to practice the invention. For example, other types of reactors may utilize different types of plasma power and magnetic power coupled into the plasma chamber using different coupling mechanisms. In some applications, different types of plasma may be generated in a different chamber from the chamber in which the substrate is located, e.g., a remote plasma source, and the plasma is subsequently guided into the chamber using techniques known in the art.

Figure 4:
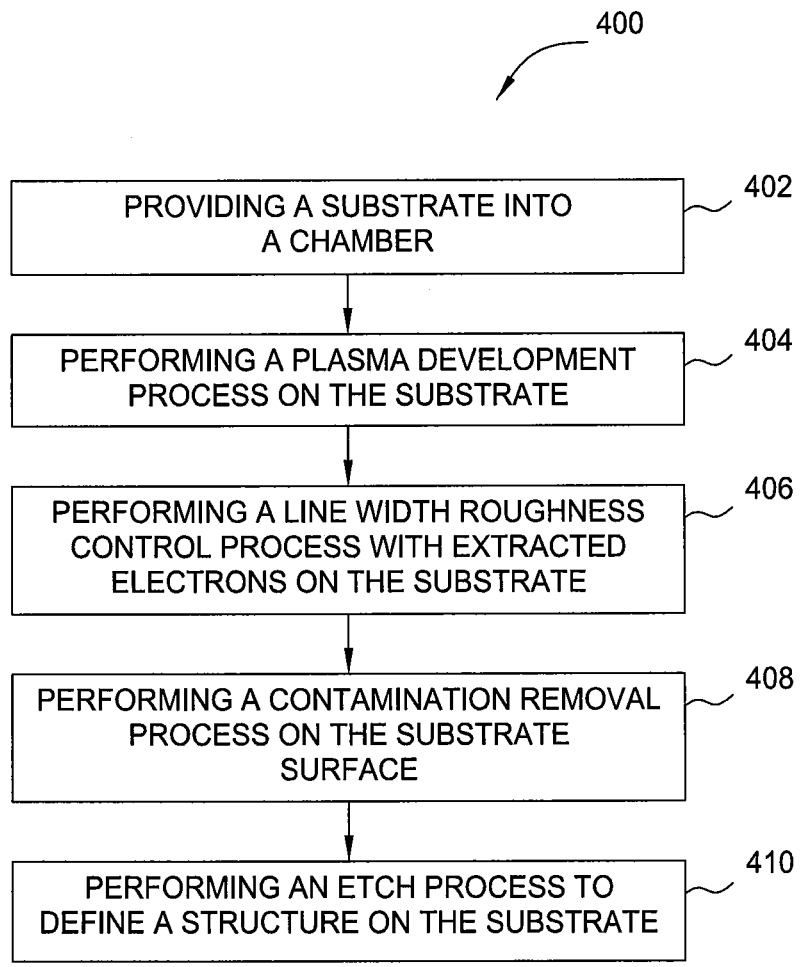
FIG. 4 depicts a flow diagram of one embodiment of performing multiple processes in the plasma reactor depicted in FIG. 2 according to one embodiment of the present invention.

FIG. 4 illustrates a flow diagram of one embodiment of a feature forming process 400 including a development process, a photoresist LWR control process, and a defect removal process along with an etching process all in one ICP processing chamber. FIGS. 5A-5F are schematic cross-sectional views of a portion of a substrate corresponding to various stages of the process 400. The process 400 may be stored in memory 242 as instructions that, when executed by the controller 240, cause the process 400 to be performed in a ICP processing chamber, such as the plasma reactor 200 depicted in FIG. 2 or other suitable reactor. It is noted that the number of the processes performed in the ICP processing chamber, including the development process, the photoresist LWR control process, the defect removal process and the etching process, to perform the feature formation process on the substrate may be removed, added, increased, repeated, eliminated, in any order as needed.

Figure 5D:
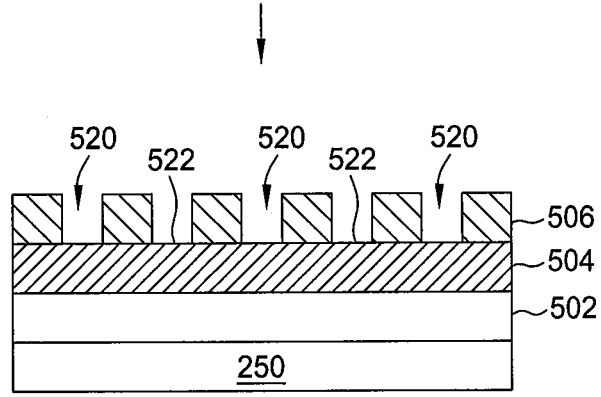

The process 400 begins at a block 402 by providing a substrate, such as the substrate 250 depicted in FIG. 2 and FIGS. 5A-5F, into the processing chamber 248 for processing. As shown in FIG. 5A, the substrate 250 may have a target material 502 to be etched disposed thereon, the target material 502 is covered by a photoresist layer 503. In one embodiment, the target material 502 to be etched may be a dielectric layer, a metal layer, a ceramic material, or other suitable material. In one embodiment, the target material 502 to be etched may be a dielectric material to be formed as one of a gate structure, a contact structure or an inter-layer dielectric structure (ILD) utilized in semiconductor integrated circuit devices. Suitable examples of the dielectric material include $SiO_2$, SiON, SiN, SiC, SiOC, SiOCN, amorphous-carbon (a-C), or the like. In another embodiment, the target material 512 to be etched may be a metal material formed as an inter-metal dielectric structure (IMD) or other suitable structures. Suitable examples of metal layers include Cu, Al, W, Ni, Cr, or the like.

In one embodiment, the photoresist layer 503 may have a bi-layer structure having a photosensitive layer 507 disposed on a non-photosensitive polymer layer 504. The photosensitive layer 507 may be a photochemically active resist used for 248-nm lithography, 193-nm lithography, 157-nm lithography, e-beam lithography, and those being developed for EUV-based lithography. The photoresist layer 503 may be on the substrate by spin coating from a solvent or other suitable technique. Alternatively, the non-photosensitive polymer layer 504 may be replaced with a hardmask layer, such as SiON, SiN, $SiO_2$, amorphous carbon, TiN, TaN, or other suitable materials as needed.

Some areas (i.e., exposed areas 505) of the photosensitive layer 507 are exposed to x-ray, electron beam, or ultraviolet radiation/light (including deep ultraviolet light and extreme ultraviolet (EUV) light, and other sources of radiant energy (for example, e-beam energy)). The radiation is sufficient to initiate a chemical reaction in the selected exposed areas 505 of the photosensitive layer 507 to increase/decrease the polarity thereof and/or increase/decrease the molecular weight thereof, so as to facilitate a selective development process performed on the photosensitive layer 507. In the embodiment depicted in FIG. 5A, the exposed areas 505 of the photosensitive layer 507 have already been selectively transformed into a state that can be readily removed during the subsequent development process, while the non-exposed areas 506 remain on the substrate 250 during the subsequent development process.

At block 404, a plasma photoresist development process is performed on the photosensitive layer 507 disposed on the substrate 250 in the ICP reactor 200 as depicted in FIG. 2. As discussed above, as conventional wet development process may be problematic to the features formed on the substrate with small sizes, the dry development process (e.g., a plasma development process) as described here may efficiently remove exposed area 505 of the photosensitive layer 507 from the substrate 250 with minimum defect/contamination left on the substrate 250, as shown in FIG. 5B. The plasma development process gently removes the exposed areas 505 of the photoresist layer 507 from the substrate, forming openings 520 with desired dimensions in the photosensitive layer 507 and leaving the remaining non-exposed areas 506 of the photoresist layer 507 on the substrate 250 undamaged. The ICP reactor as used for performing the dry development process utilizes a mild reactive species (mild e-beam source) to remove the exposed areas 505 of the photoresist layer 507. The substantial absence of ions and high energy during the dry development process allows mild electron collisions and gentle chemical reactions to gently remove material, as opposed to the use of aggressive ion bombardment with high bombardment energy that may adversely damage the structures 500 formed on the substrate 250 in convention etch processes. After the exposed areas 505 of the photoresist layer 507 are removed from the substrate, the remaining non-exposed areas 506 of the photoresist layer 507 may act as a mask layer utilized to transfer features onto the underlying non-photosensitive polymer layer 504 and to further target the material 502.

During dry development processing, at block 404, several process parameters may be controlled to maintain the mild dry development plasma within a desired process window. In one embodiment, the plasma power may be supplied to the coils 208 in a range of between about 200 Watts and about 1000 Watts. DC and/or AC voltage of between about 50 Volts and about 200 Volts is applied to the shield plate 262 to filter ions from the plasma generated by the plasma source 202. DC and/or AC power of between about 100 Watts and about 2000 Watts may be applied to the control plate 264 to generate electric filed for the processing chamber. The electric filed generated by the control plate 264 also assists in controlling the velocity of the mild reactive species directed towards the substrate 250 disposed on the support pedestal 214. The magnetic field generated by the coils 221A, 221B may be controlled between about 500 Gauss (G) and about 2000 G, which is utilized to maintain and confine the spinning motion of the mild reactive species in the lower portion of the interior processing region 212 directly above the support pedestal 214. The pressure of the processing chamber may be controlled at between about 0.5 milliTorr and about 500 milliTorr. A processing gas may be supplied into the processing chamber to assist in removing the exposed areas 505 of the photoresist layer 507. As the materials selected for exposed areas 505 of the photosensitive layer 507 are often organic materials, an oxygen containing gas may be selected as the processing gas to be supplied into the processing chamber to assist dry plasma developing the exposed area 505 of the photosensitive layer 507. Suitable examples of the oxygen containing gas include $O_2$, $N_2O$, $NO_2$, $O_3$, $H_2O$, $CO$, $CO_2$, and the like. Other types of processing gas may also be supplied into the processing chamber, simultaneously or individually, to assist in dry plasma developing the photosensitive layer 507. Suitable examples of the processing gas include $N_2$ or inert gas, such as Ar or He. The processing gas may be supplied into the processing chamber at a flow rate between about 50 sccm to about 400 sccm, for example, about between about 100 sccm to about 150 sccm. The process may be performed between about 100 seconds and about 500 seconds. In one particular embodiment, the oxygen gas is supplied as the processing gas into the processing chamber to react and develop the exposed areas 505 of the photosensitive layer 507.

At block 406, after the dry plasma development process of block 404, a photoresist LWR control process 400 may be performed on the substrate 250 to grind, modify and trim edges 508, 510 of the remaining areas 506 of the photosensitive layer 507, resulting in a substantial flattening or smoothing for the roughness of the edges 512, 514, as shown in FIG. 5C. The photoresist LWR control process is performed by generating an ICP in the processing chamber 248 to provide a source of electrons. The electrons may alternatively be provided by another source. The ICP is generated by the plasma source 202 coupled to the processing chamber 248. As discussed above, the plasma as generated may include different types of reactive species, such as electrons, charges, ions, neutral species, and so on either with positive or negative charges. The ions within the excited ICP are filtered out, and the extracted electrons then move and accelerate in a circular motion toward the upper surface 253 of the substrate 250 to grind, trim and modify the LWR of the remaining non-exposed areas 506 of the photosensitive layer 507 (e.g., hereinafter referred to as the patterned photosensitive layer 507). The amount of electrons and/or other mild species extracted from the ICP may be controlled using the control and shield plates 262, 264 as describe above to balance the etching speed (more ions) with less aggressive etching and damage reduction (less ions).

Figure 6:
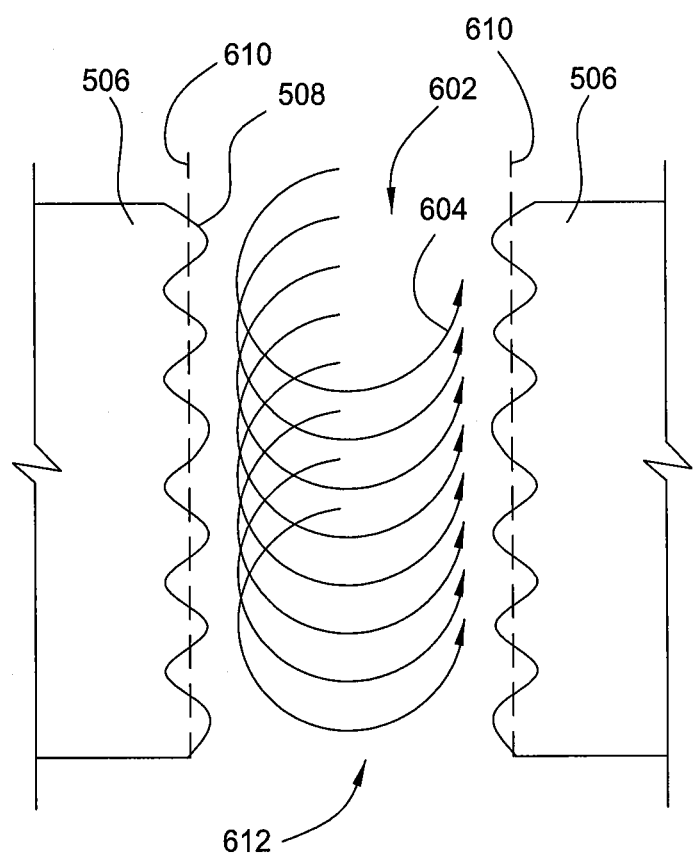
FIG. 6 depicts a profile of a LWR of a photoresist layer disposed on a substrate according to one embodiment of the invention.

The LWR of the patterned photosensitive layer 507 may be controlled during the ICP process. Referring first to FIG. 6, the circular movement 604 of the electrons may smoothly grind, collide, and polish away the uneven edges 508 of the patterned photosensitive layer 507. The circular movement 604 includes a substantial horizontal motion component that allows the uneven edges 508 to be smoothed along the complete vertical height of the edges 508 simultaneously such that the top portion of the edges 508 are not predominately etched as with conventional isotropic etching which could result in a tapered feature and loss of good critical dimension control. The process may be continuously performed until a desired degree of roughness, e.g., straightness or smoothness, (as shown by imaginary line 610) of patterned photosensitive layer 507 is achieved. By good control of the electron momentum, the uneven surfaces and protrusions from edges 508 of the patterned photosensitive layer 507 may be gradually flattened out, thereby efficiently controlling the photoresist LWR within a desired minimum range. The electron momentum or neutral species concentration may be controlled by the power generated from the interaction between the magnetic field and the electric field and the gases supplied thereto. In one embodiment, by adjusting the power supplied to generate the electric field (power to coils 208 and/or control plate 264) and the magnetic field (power to coils 221A, 221B) different electron momentum or mobility may be obtained.

During processing, at block 406, several process parameters may be controlled to maintain the LWR of the patterned photosensitive layer 507 at a desired range. In one embodiment, the plasma power may be supplied to the coils 208 in a range of between about 50 watts and about 2000 watts. DC and/or AC power may be applied to the control plate 264 between about 100 watts and about 2000 watts may be used to generate magnetic field in the processing chamber. The magnetic field generated by the coils 221A, 221B may be controlled between about 500 Gauss (G) and about 1000 G. The pressure of the processing chamber may be controlled at between about 0.5 milliTorr and about 500 military. A processing gas may be supplied into the processing chamber to assist modifying, trimming, and controlling the edge roughness of the patterned photosensitive layer 507. As the materials selected for the patterned photosensitive layer 507 are often organic materials, an oxygen containing gas may be selected as the processing gas to be supplied into the processing chamber to assist in grinding and modifying the roughness and profile of the patterned photosensitive layer 507. Suitable examples of the oxygen containing gas include $O_2$, $N_2O$, $NO_2$, $O_3$, $H_2O$, $CO$, $CO_2$, and the like. Other types of processing gas may also be supplied into the processing chamber, simultaneously or individually, to assist in modifying the roughness of the patterned photosensitive layer 507. Suitable examples of the processing gas include $N_2$, $NH_3$, $Cl_2$ or inert gas, such as Ar or He. The processing gas may be supplied into the processing chamber at a flow rate between about 10 sccm to about 500 sccm, for example, about between about 100 sccm to about 200 sccm. The process may be performed between about 30 seconds and about 200 seconds. In one particular embodiment, the $O_2$ gas is supplied as the processing gas into the processing chamber to react with the patterned photosensitive layer 507 so as to trim and modify the LWR of the patterned photosensitive layer 507 disposed on the substrate 250.

The photoresist LWR control process may be continuously performed until a desired minimum roughness of patterned photosensitive layer 507 is achieved. In one embodiment, LWR of the patterned photosensitive layer 507 may be controlled in a range less than about 3.0 nm, such as between about 1.0 nm and about 1.5 nm. The photoresist LWR control process may be terminated after reaching an endpoint signal indicating that a desired roughness of patterned photosensitive layer 507 is achieved. Alternatively, the photoresist LWR control process may be terminated by a preset time mode. In one embodiment, the photoresist LWR control process may be performed for between about 100 seconds and between about 500 seconds.

After the photoresist LWR control process is performed at block 406, some residuals or contaminates 516 may be left and remained on the substrate surface, as shown in FIG. 5C. At block 408, a contamination removal process (i.e., a descum process) may be performed to remove residuals or contaminates 516 from the substrate surface, resulting in a clean substrate surface, as shown in FIG. 5D, in preparation for a subsequent etching process. The contamination removal process may be performed by supplying a gas mixture including at least an oxygen containing gas into the processing chamber to react with the residuals or contaminates 516 so as to remove them from the substrate surface. In one embodiment, the oxygen containing gas is supplied at block 408 is $O_2$ or $CO_2$ gas. Process parameters may be similarly controlled as the process is controlled at block 404 and 406 for performing the dry development process and LWR control process.

Figure 5E:
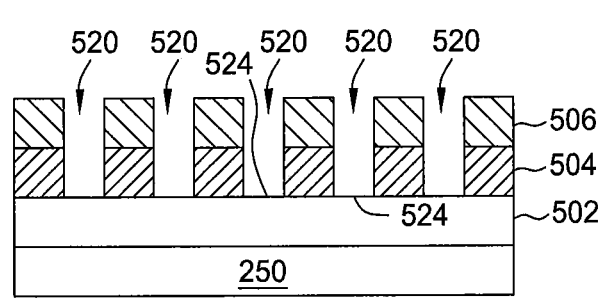

At block 410, after the residuals or contaminates 516 are removed from the substrate 250, a mild electron etching process is performed to etch the non-photosensitive polymer layer 504 exposed by the patterned photosensitive layer 507, as shown in FIG. 5E. Instead of using a traditional ion plasma etching, a mild electron etching process is performed in the processing chamber 248 to gently remove the non-photosensitive polymer layer 504 from the substrate without damaging the substrate or deteriorating the critical dimension as defined by the patterned photosensitive layer 507 using mild reactive species. The aggressive ions, reactive species, charges and electrons in highly excited states present in conventional ion plasma etch processes are accelerated toward the substrate surface for etching and the resulting high energy ion bombardment may cause damage to the substrate, thereby resulting in critical dimension loss or features collapse. Therefore, utilizing a mild reactive species set in a circular motion gently grinds and etches the non-photosensitive polymer layer 504 to expose the underlying target material 502 for further etching in a more controlled fashion with substantially diminished risk of damage. In the embodiment where the non-photosensitive polymer layer 504 is not present but a hardmask layer is used instead, the mild reactive species etching process may also be utilized to etch the hardmask layer as needed.

Figure 5F:
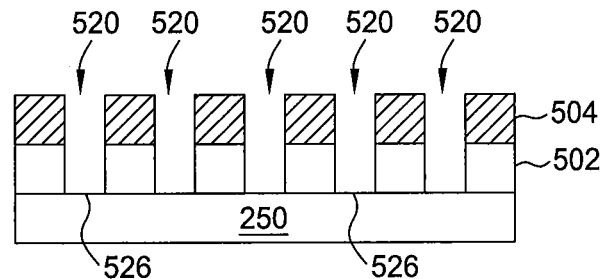

In one embodiment, the mild reactive species etching process may be performed by supplying a gas mixture including at least an oxygen containing gas into the processing chamber to react with the non-photosensitive polymer layer 504. After the non-photosensitive polymer layer 504 is etched, the underlying target material 502 may also be etched using the etched non-photosensitive polymer layer 504, as shown in FIG. 5F, to expose an upper surface 526 of the substrate 250 in the same chamber or in any other different suitable etching chamber integrated in a cluster system where the LWR process chamber may be incorporated thereto. During the etching of the target material 502, the gas mixture as used may be different from the gas mixture utilized to perform the above described process, such as dry development process, LWR process, contamination removal process, and non-photosensitive polymer removal process. In one embodiment, the gas mixture utilized to etch the underlying target material 502 includes a halogen containing gas, such as fluorine carbon gas, chlorine containing gas, bromide containing gas, fluorine containing gas, and the like. In another embodiment, the gas mixture utilized to etch the underlying target material 502 may include Ar or He to promote etching of the underlying target material 502 during etching.

Thus, the present invention provides methods and apparatus for controlling and minimizing process defect in a development process, and modifying LWR of a photoresist layer after the development process, and maintaining good profile control during subsequent etching processes. The method and apparatus can advantageously control, modify and trim the profile, LWR and dimensions of the photoresist layer disposed on a substrate after a resist exposure process, thereby providing accurate critical dimension control of an opening in the photoresist layer so the subsequent etching process may accurately transfer critical dimensions to the underlying layer being etched through the opening.

While the foregoing is directed to embodiments of the present invention, other and further embodiments of the invention may be devised without departing from the basic scope thereof, and the scope thereof is determined by the claims that follow.

What is claimed is:

1. A method for forming features on a substrate comprising:
    transferring a substrate into a processing chamber, wherein the substrate has a photosensitive layer having exposed areas and non-exposed areas;
    extracting electrons from a plasma formed from a first gas mixture;
    developing the exposed areas in the photosensitive layer using the electrons extracted from the plasma formed in the first gas mixture;
    extracting electrons from a plasma formed from a second gas mixture supplied to the processing chamber; and
    trimming an edge profile of the developed photosensitive layer disposed on the substrate using electrons extracted from the plasma formed from the second gas mixture.

2. The method of claim 1, further comprising:
    supplying a third gas mixture into the processing chamber;
    generating a third plasma from the third gas mixture;
    directing mild reactive species having ions filtered from the third plasma towards the substrate; and
    removing contaminates from the substrate generated from the first and the second plasma using the mild reactive species filtered from the third plasma.

3. The method of claim 2, wherein the substrate further comprises a non-photosensitive polymer layer disposed under the photosensitive layer.

4. The method of claim 3, further comprising:
    supplying a fourth gas mixture into the processing chamber;
    generating a fourth plasma in a magnetic field and an electric field formed from the fourth gas mixture; and
    etching the non-photosensitive polymer layer exposed by the developed photosensitive layer using mild reactive species having ions filtered from the fourth plasma.

5. The method of claim 4, wherein the fourth gas mixture includes an oxygen containing gas.

6. The method of claim 4, wherein the magnetic field and the electric field generated in the processing chamber maintain electrons in the plasma moving in a circular mode to the substrate surface while supplying the fourth gas mixture.

7. The method of claim 3, wherein the substrate further comprises a target material disposed between the substrate and the non-photosensitive polymer layer.

8. The method of claim 7, further comprising:
    supplying a fifth gas mixture into the processing chamber; and
    generating a fifth plasma from the fifth gas mixture to etch the target material using the etched non-photosensitive polymer layer as a mask.

9. The method of claim 8, wherein the fifth gas mixture includes a halogen containing gas.

10. The method of claim 2, wherein the third gas mixture includes an oxygen containing gas.

11. The method of claim 2, wherein a magnetic field and an electric field generated in the processing chamber maintain electrons in the plasma moving in a circular mode to the substrate surface while supplying the third gas mixture.

12. The method of claim 1, wherein the first and the second gas mixture includes an oxygen containing gas.

13. A method for developing a photosensitive layer disposed on a substrate comprising:
    transferring a substrate having a photosensitive layer having exposed areas and non-exposed areas into an electron processing chamber;
    extracting electrons from a plasma formed from a gas mixture supplied into the electron processing chamber; and
    dry developing the photosensitive layer to remove the exposed areas of the photosensitive layer from the substrate or to remove the non-exposed area with the electrons extracted from the plasma.

14. The method of claim 13, wherein extracting electrons from the plasma further comprises:
    filtering ions from the plasma.

15. The method of claim 14, further comprising:
    extracting neutral species from the plasma.

16. The method of claim 13, wherein the gas mixture includes an oxygen containing gas.

17. A method for forming features on a substrate comprising:
    transferring a substrate into an electron processing chamber; wherein the substrate has a photosensitive layer disposed on a non-photosensitive polymer layer, the photosensitive layer having exposed areas and non-exposed areas;
    extracting electrons from a plasma;
    developing and removing the exposed areas in the photosensitive layer by using the electrons extracted from the plasma;
    trimming an edge profile of the developed photosensitive layer disposed on the substrate in the electron processing chamber by using the electrons extracted from the plasma;
    removing contaminants on the substrate by using the electrons extracted from the plasma; and
    etching the non-photosensitive polymer layer exposed by the developed photosensitive layer in the electron processing chamber by using the electrons extracted from the plasma.

18. The method of claim 17, further comprising:
    etching a target material disposed between the etched non-photosensitive polymer layer and the substrate in the presence of ions.

19. The method of claim 17, wherein the plasma is formed from an oxygen containing gas.

* * * * *